United States Patent [19]

Randall

[11] Patent Number: 4,631,604
[45] Date of Patent: Dec. 23, 1986

[54] BIASING FOR MAGNETIC CIRCUITS
[75] Inventor: Bruce E. Randall, Alpharetta, Ga.
[73] Assignee: Sangamo Weston, Inc., Norcross, Ga.
[21] Appl. No.: 685,503
[22] Filed: Dec. 24, 1984
[51] Int. Cl.$^4$ ........................... G11B 5/03; G11B 5/02
[52] U.S. Cl. ......................................... 360/66; 360/25
[58] Field of Search ............. 324/117 H; 360/66, 112, 360/25, 31; 365/28

[56] References Cited

U.S. PATENT DOCUMENTS 2,604,546  7/1952  Connell .................................. 360/66
4,454,548  6/1984  Jensen .................................... 360/66

Primary Examiner—Vincent P. Canney
Attorney, Agent, or Firm—Dale Gaudier

[57] ABSTRACT

A magnetic circuit, such as used in a magnetic recording head, or with a Hall-effect device, is biased by applying signals having noise-like properties to the magnetic circuit. Since the biasing signals will be effectively uncorrelated with other signals being applied to the magnetic circuit, the biasing signals cannot introduce an offset in the applied signals which might otherwise cause distortion. In addition, the spectrum of the biasing signals is broadband and of low amplitude. As a result, the biasing signals are unlikely to cause interference with other nearby electrical components.

8 Claims, 6 Drawing Figures

BIASING FOR MAGNETIC CIRCUITS

BACKGROUND OF THE INVENTION

The invention relates to the field of biasing of magnetic circuits, and more particularly to a technique for biasing the magnetic circuit of a magnetic recording head or a Hall-effect device using signals having noise-like properties.

In the magnetic recording art, it is common to apply high frequency (e.g. 100 KHz) AC biasing signals to the magnetic circuit of a magnetic recording head, such as used in a magnetic tape recorder. Such AC biasing is utilized to correct for distortion inherent in most magnetic systems. This distortion is due to the well known phenomena that the graph of magnetic induction (B) vs. magnetic force (H) in the gap of a magnetic circuit (such as a broken toroid of ferromagnetic material used in magnetic recording heads or in conjunction with Hall-effect devices) is not a smooth curve or straight line, but is a rather non-linear function. Thus the smooth periodic nature of a signal being applied to the magnetic circuit (e.g. an audio, video, or data signal), in the case of a magnetic recorder, or the measurement of electric current in the case of a Hall-effect device) will be distorted by the characteristic non-linear function of the magnetic circuit to produce an output which is a distorted version of the input signal. In the case of magnetic recording, the magnetic recording material also exhibits a highly nonlinear magnetic response to an external magnetic field. This also acts to distort a signal which is being recorded on the magnetic material. By applying AC biasing signals to the magnetic circuit, and hence to the magnetic recording material, the envelope of the resultant recorded signal will be shifted away from the highly non-linear portion of the B-H curve to a portion of the curve which is more nearly linear. This results in a composite signal being recorded which more accurately represents the signal being applied to the magnetic circuit. The application of AC biasing signals to the magnetic circuit of a Hall-effect device causes a similar improvement in the linearity of response of the magnetic circuit to an applied signal.

Such an AC biasing technique is well-known for use in the magnetic tape recorder art. See for example "Magnetic Recording", C. Lowman, McGraww-Hill, 1972, pp. 69-74. In addition, in Applicant's co-pending application Ser. No. 451,306, filed Dec. 20, 1982, entitled "Power Distribution in an Electrical Distribution System Having Three or More Wires", there is described a technique for utilizing an AC biasing system with the magnetic circuit of a Hall-effect device, similar to that described above.

One problem associated with the use of AC biasing in these prior art recording and power measuring systems is that the AC biasing frequency must be carefully selected to not be a harmonic or sub-harmonic of any of the normally expected frequencies of the signals of interest. In an audio recorder, the AC biasing signals are frequently placed several octaves higher than the highest expected frequency of the signals of interest (e.g. 20 KHz). Since the recording head is usually optimized for frequencies below 20 KHz, strong "roll-off" occurs above this frequency. Thus the AC biasing signals (which may have a frequency of around 100 KHz) will have to be injected at a fairly high amplitude into the magnetic circuit to insure adequate compensation for magnetic non-linearities. A similar approach is often used in data recorders, with the biasing frequency being chosen so as to minimize interference with the signals being recorded.

In a Hall-effect device used as a power measuring instrument, the AC biasing frequency is chosen to be several times higher than the line frequency of the electrical distribution circuit (e.g. 50 or 60 Hertz) and normally at a frequency which is not a harmonic of the power line frequency. This is to minimize the amount of correlation between the biasing signals and the measured power line signal, which might otherwise interfere with each other.

However, in both the magnetic recording and power measuring environments, the high frequency, high amplitude signals normally utilized for AC biasing can propagate as free electromagnetic waves or can be conducted over adjacent wires and circuitry and cause interference to the recording apparatus or power measuring apparatus or other peripheral equipment. In addition, since both the AC biasing signals and the signals being recorded or measured are both of a generally periodic (e.g. sinsuoidal) nature, there will always be some degree of correlation inherent between the signals, so that some error of offset in the recorded or measured signals may occur. Obviously, such error and offset signals can cause distortion in recording a signal or an error in the amount of power being measured by a Hall-effect power measuring device.

SUMMARY OF THE INVENTION

These and other problems associated with prior art magnetic biasing techniques are ovecome by the present invention in which a magnetic circuit is biased by applying a sequence of essentially uncorrelated signals having a noise-like characteristics to the magnetic circuit. The signals, for example, may be random noise having a Gaussian or non-Gaussian distribution, or a pseudorandom noise sequence. The biasing signals may be used to bias the magnetic circuit of a magnetic recording head, or the magnetic circuit associated with a Hall-effect device.

The use of biasing signals having noise-like properties in place of AC biasing signals has several advantages. Since the noise-like signals are essentially uncorrelated, there is no way for these signals to have a regular, periodic relationship to the signals being applied to a magnetic recording head or power measuring signals being applied to a Hall-effect device. This means that the problem of harmonics or "beat notes" or other types of interference between the biasing signals and the signal being applied to the magnetic circuit cannot occur. Also, since the noise-like signals will be spread across a fairly broad band of frequencies, the average power of the biasing signals at a particular frequency will be relatively low, and will therefore be unlikely to add any offset or error components to the signal being applied to the magnetic circuit. The broadband nature of the biasing signals means that the signals may be applied throughout the spectrum of optimum response of the magnetic circuit, rather than at one end of the frequency response characteristic of the magnetic circuit. This results in the biasing signals being optimally utilized by the magnetic circuit, rather than being applied at a point where distortion or attenuation may occur, such as is the case with the narrow-band AC biasing signals used in prior art devices.

The biasing techniques of the present invention are also relatively simple and inexpensive to implement with readily available circuitry.

BRIEF DESCRIPTION OF THE DRAWING FIGURES

These and other features and advantages of the present invention will be understood from the following description of the preferred embodiment of the invention, when taken in conjunction with the drawing figures wherein.

Figure 1:
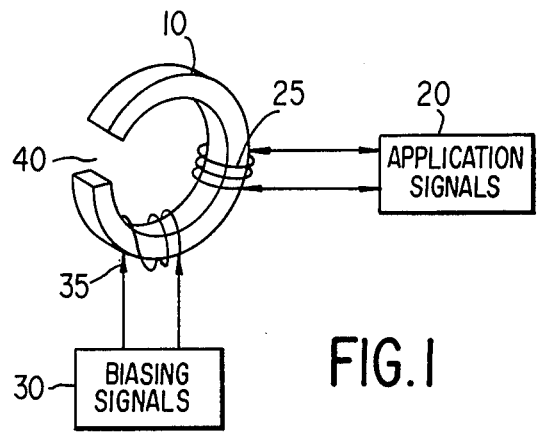
FIG. 1 shows a magnetic circuit and associated biasing components constructed in accordance with the principles of the present invention.
Figure 5:
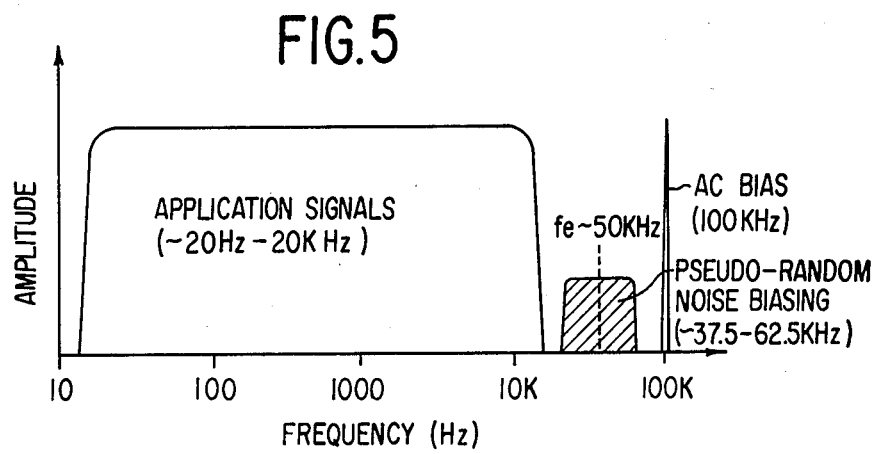
Figure 3:
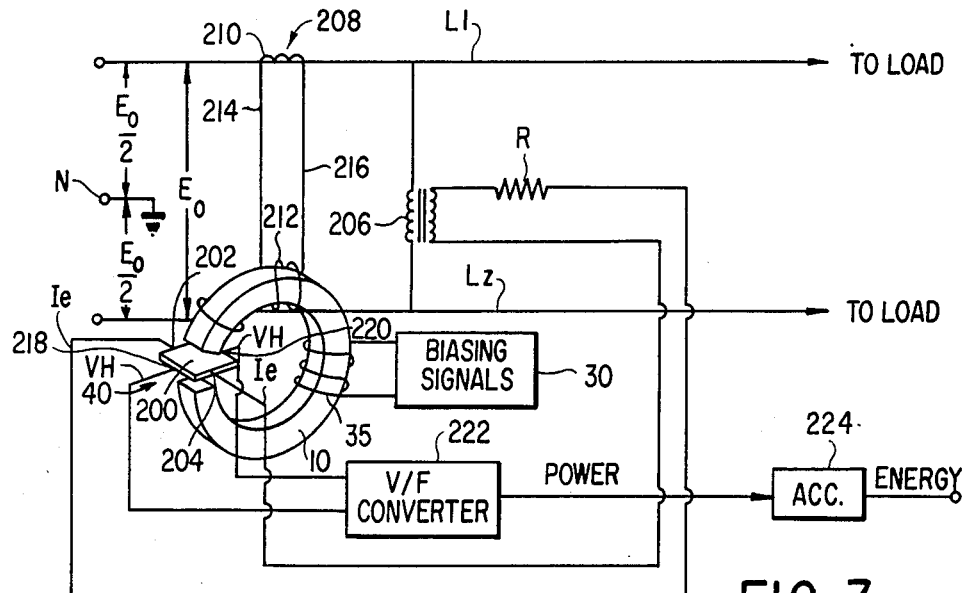
FIG. 3 illustrates the biasing techniques of the present invention as applied to a Hall-effect device utilized as a power measuring apparatus.
Figure 4A:
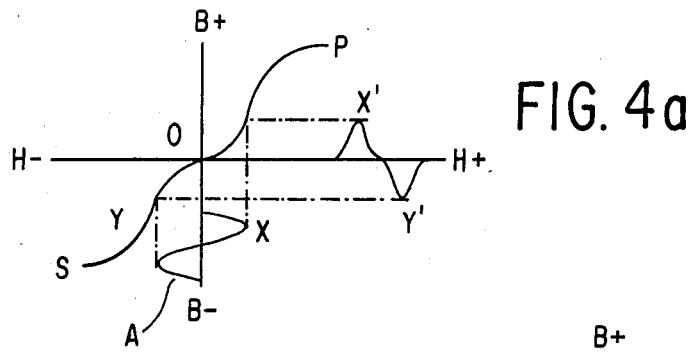
Figure 4B:
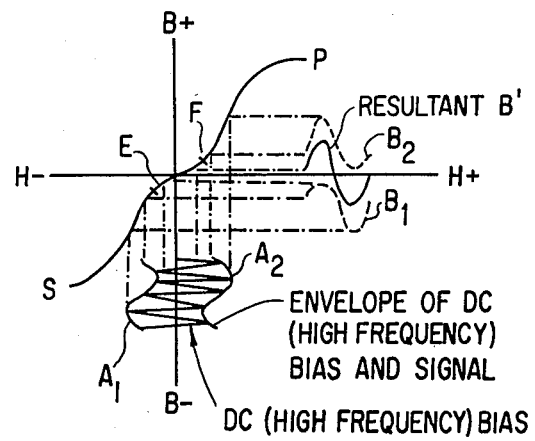

FIG. 4A illustrates the graph of magnetic induction (b) vs. magnetic force (H) when no biasing signal is applied to the magnetic circuits of FIGS. 1 or 3, while FIG. 4B shows the graph of magnetic induction vs. magnetic force when noise-like biasing signals are applied to a magnetic circuit; and FIG. 5 is a graph of signal amplitude vs. frequency for a magnetic circuit biased with AC biasing signals and noise-like biasing signals.

DETAILED DESCRIPTION OF THE PREFERRED EMBODIMENTS

FIG. 1 shows a magnetic circuit 10 to which is coupled a source of application signals 20 and a source of biasing signals 30. Magnetic circuit 10, for example, may be a toroid of ferro-magnetic material having a gap 40 provided therein. The application signal source 20 is inductively coupled by one or more turns 25 of an electrical conductor disposed about a portion of magnetic circuit 10. The application signals may be, for example, periodic (e.g. sinusoidal, square wave, etc.) audio, video, or data signals, or signals representative of some time-varying electrical parameter being measured, such as current in an electrical power distribution line.

As is well-known, if a source of time-varying signals is applied to a magnetic circuit such as 10, a magnetic field will be induced in gap 40 whose magnitude will be proportional to the amplitude of the signals being applied by source 20, and whose direction fluctuates in accordance with the sense of current flow through winding 25 due to the chang in polarity of the applied time-varying signals from source 20.

For example, the application signals can be representative of an audio frequency and the magnetic field reversals will occur in gap 40 at the same rate as the application signal frequency. If a moving piece of magnetic media (e.g. magnetic tape or a magnetic disk) is placed near gap 40, these frequency related reversals will be recorded as a series of magnetically reversed domains in the magnetic material.

Conversely, if magnetic media containing such recorded domain reversals is moved past gap 40 of magnetic circuit 10, a current will be induced in windings 25, whose frequency will be directly related to the number of magnetic domain reversals occuring over a given length of magnetic media, and whose amplitude will be proportional to the degree of magnetization of a particular domain. These recorded signals may then be amplified and utilized by suitable playback circuitry. As used herein, the source of application signals 20 may also include this amplifying and playback circuitry.

The graph of magnetic induction (B) vs. magnetic force (H) in a magnetic circuit such as 10 will exhibit a non-linear transfer function, such as shown in FIG. 4A. Thus, if a sinusoidal input signal A is applied to magnetic circuit 10, the magnetic flux appearing in the circuit (curve B) will be a distorted version of the input signal A due to the highly non-linear characteristics of the magnetic circuit, as shown by curve S-P. Magnetic recording media exhibit a similar nonlinear transfer function and thus will cause the recorded signal to be further distorted.

The application of high-frequency AC bias signals to the input signal A will cause the input signal to be modulated at the bias frequency. The evnelope of the resultant signal A1 and A2 (FIG. 4B) is then shifted away from the highly non-linear portion E-F of curve S-P to a portion of curve S-P which is more nearly linear, as shown in FIG. 4B. The resultant changes in magnetic flux (curves $B_1$ and $B_2$) when added together (curve B') results in a composite magnetic flux appearing in gap 40 (and therefore applied to any magnetic media disposed therein) which is a relatively accurate representation of the signal being applied to the magnetic circuit.

However, such AC biasing suffers from several drawbacks. The AC biasing frequency must be carefully chosen so as to not affect or interfere with the signals of interest being applied to the magnetic circuit. This usually required that the AC biasing signals be non-harmonically related to the signals of interest, and at a relatively high frequency in relationship with respect to these signals. However, magnetic circuits generally operate well only over a certain band of frequencies. Outside of this band, a signal applied to the magnetic circuit will be attentuated. This means that the AC biasing signals, which are usually placed at the upper end of the operating spectrum of the magnetic circuit, will have to be applied to a relatively high amplitude to overcome the attenuation effects of the magnetic circuit and to insure that the magnetic circuit is properly biased.

Such AC biasing signals will therefore have a fairly high amplitude over a narrow frequency band. As a result, the signals may radiate as electromagnetic waves through free space or over adjacent conductors and thereby cause interference with other nearby electrical components. Further, such AC biasing signals are by their nature periodic, and therefore there will always be some degree of correlation between the biasing signals and the signal of interest being applied to the magnetic circuit. Depending upon the degree of correlation, a certain amount of error or offset will be introduced into the signal of interest, thereby distorting this signal.

The present invention overcome these problems inherent in AC biasing of magnetic circuits by utilizing a source of essentially uncorrelated signals having noise-like properties and applying these signals to the magnetic circuit 10.

Figure 2:
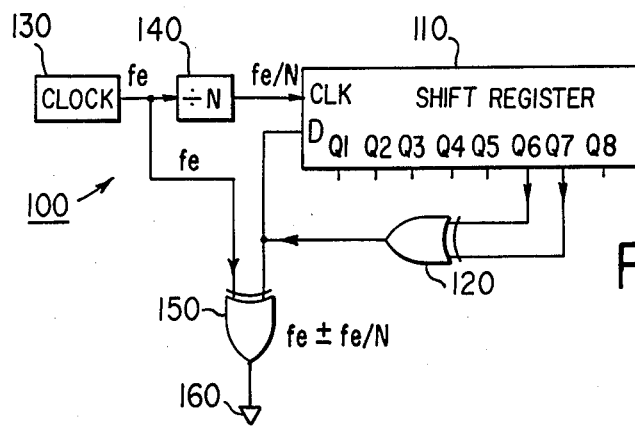
FIG. 2 shows one type of circuitry useful for generating noise-like biasing signals for application to a magnetic circuit.

As shown in FIG. 1, the source of these biasing signals 30 is coupled to magnetic circuit 10 by means of an inductive coupling 35 comprising one or more turns of a conductor wound about magnetic circuit 10. The biasing signals may be, for example, generated by a source of random noise (e.g. so called "white" or "pink" noise). The noise signals may have a Gaussian or non-Gaussian distribution. Preferably, however, the source of noise-like signals 30 is a pseudorandom noise source, such as shown in FIG. 2.

The source of biasing signals 30 comrpises a pseudorandom noise generator 100. Pseudorandom noise generator 100 includes a shift register 110 having a signal applied to its input D from exclusive-OR gate 120. Exclusive-OR gate 120 receives signals at its two inputs from two of the shift register positions Q6 and Q7. Clock 130 applies a signal at a frequency fc to the CLK input of shift register 110 via divide-by-N divider 140. The output of the clock is also applied to one input of a second exclusive-OR gate 150. The output of exclusive OR gate 120 is applied to the other input of gate 150.

It will be appreciated that each N applications of the clock signal to shift register 110 causes the bits contained in the shift register to be shifted one position to the right (away from the D input). Assuming that shift register 110 holds up to eight bits, and the Q6 and Q7 represent the sixth and seventh bit positions of the register, it will be appreciated that the output of exclusive-OR gate 120 will be pseudorandom sequence of bits which will repeat after every 127 bits. The frequency spectrum of signal 160 output from gate 150 will range from $\pm fc/N$ about the clock frequency, fc. Thus, if the clock rate is selected to be, for example, 50 KHz, and N=4, the frequency spectrum of the pseudorandom sequence will range from approximately 37.5 KHz to 62.5 KHz, with a nominal center frequency of 50 KHz (the clock frequency).

FIG. 3 shows the use of the biasing techniques of the present invention in conjunction with a Hall-effect device arranged for the measurement of electrical power flowing through one or more electrical lines. The arrangement shown in FIG. 3 is similar to that described in the aforementioned co-pending application, Ser. No. 451,306, and enables single phase power flowing in a pair of electrically "hot" or "live" lines, L1 and L2, to be measured by a single Hall device 200 disposed in the gap 40 of magnetic circuit 10, in this case of toroid formed of ferromagnetic material. The planar surfaces of Hall-effect device 200, which is formed from a galvanomagnetic material, are arranged essentially parallel to the inner faces of gap 40 of magnetic circuit 10. Opposite edges of Hall-device 200 have terminals 202 and 204 formed thereon for receiving an excitation current $I_e$. The excitation current $I_e$ preferably is derived from the potential $E_0$ between each of the live wires L1 and L2 by means of a voltage transformer 206 having its primary connected between live wires L1 and L2 and its secondary connected through R to terminals 202 and 204 of Hall device 200. The value of resistor R is chosen to be much greater than the internal resistance of the plate of material 200 (on the order of 2-3 orders of magnitude greater) so that the voltage transformer and resistance act as a current source for the excitation current $I_e$ being supplied to device 200.

The time-varying alternating current flowing in live wire L1 induces in current transformer 208 a time-varying magnetic field whose instantaneous magnitude is directly proportional to the instantaneous value of the current flowing in live wire L1. The magnetic field from current transformer 208 is coupled to magnetic circuit 10 by means of transformer windings 210 and 212 and electrical links 214 and 216. Thus, the magnetic field induced in transformer 208 is magnetically linked to magnetic circuit 10. This causes a magnetic flux to appear across gap 40 which is proportional to the magnetic field induced in the current transformer 208, which in turn is proportional to current flowing in live wire L1.

In addition to the magnetic flux induced by current transformer 208, a second magnetic flux is induced by the magnetic field which accompanies current flowing through live wire L2. Magnetic circuit 10 is placed in physical proximity to live wire L2, such that the magnetic field accompanying the current in the live wire L2 is directly coupled to the magnetic circuit. This magnetic coupling can constitute one or more ampere turns of wire L2 physically coupled to magnetic circuit 10.

As will be appreciated, the total flux appearing in gap 40 of magnetic circuit 10 will be the vector sum of each of the magnetic fluxes being induced therein due to the currents flowing in live wires L1 and L2. With the excitation current $I_e$, which is directly proportional to the potential being applied across live wires L1 and L2, the plate of galvanomagnetic material 200 will have a voltage $V_H$ induced therein at a pair of terminal 218 and 220 disposed on opposite flow between terminals 202 and 204. The magnitude of this induced voltage $V_H$ is directly proportional to the product of the vector sum of the magnetic fluxes induced by the current flowing through live wires L1 and L2 and the potential $E_0$ between these two live wires. Thus, the induced output voltage in plate 200 is directly proportional to the instantaneous power (voltage times current) flowing to one or more loads connected to live wires L1 and L2.

This induced voltage may be read out directly, such as by means of a voltmeter, to give an indication (when properly scaled) of the instantaneous power or demand flowing to the loads.

A more useful technique, though, is to apply this powerrepresentative voltage to a voltage-to-frequency converter 222. The output of the voltage-to-frequency converter is a series of pulses whose frequency is proportional to the applied voltage. If the output of voltage-to-frequency converter 222 is properly scaled and applied to a frequency counter, the output of the counter at any time is a direct representation of instantaneous power. If the counts are accumulated by the frequency counter over a preselected period of time, the total number of counts is indicative of the amount of energy (power integrated over an interval of time) being consumed by the one or more loads connected to the distribution circuit. Alternatively, a separate accumulator 224 may be provided which will count the pulses output by voltage-to-frequency converter 222 over a given time interval. Examples of such accumulators are electronic registers or counters, or a stepper motor which is responsive to the pulses output by converter 222 to drive a clock-type or cyclometer-type escapement mechanism to integrate the power over a given time interval.

As shown in FIG. 3, a source of biasing signals 30 having noise-like properties is applied to magnetic circuit 10 by means of an inductive coupling 35. As described above with respect to FIG. 1, these biasing signals may be noise-like signals having a Gaussian or non-Gaussian distribution, or they may be a pseudorandom noise sequence, such as produced by generator 100 shown in FIG. 2.

It has been found that the use of biasing signals having noise-like properties in conjunction with a magnetic circuit 10 provides a biasing effect and improves the linearity of the transfer function of the magnetic circuit (and therefore the linearity of any signals being recorded on associated magnetic media when used in magnetic recorder), which is at least as good as provided by AC biasing (see FIG. 4B). Further, because of the broadband nature of the noise-like biasing signals, the effective power of the biasing signals is greatly reduced at any particular frequency in contrast to the relatively high amplitude signal produced at the biasing frequency when AC biasing is utilized. This results in a reduced likelihood of the biasing signals being radiated or conducted to nearby components or devices to cause interference. Also, because of the uncorrelated nature of the noise-like biasing signals, beat frequencies and other harmonic phenomena associated with using biasing signals of a periodic nature cannot occur. This reduces the possibility that the biasing signals will introduce any sort of offset or error signal into the application signals of interest. To illustrate this, FIG. 5 shows a graph of frequency vs. amplitude for AC biasing signals of 100 KHz applied to magnetic circuit 10 such as shown in FIGS. 1 and 3 and a pseudorandom noise sequence applied to this same magnetic circuit (shaded area). The pseudorandom noise sequence is generated in accordance with FIG. 2, where the clock frquency (fc) is 50 KHz and N=4.

As is apparent, the AC biasing signals have a strong peak at their fundamental (100 KHz) and will have corresponding minor peaks at their second harmonic, third harmonic, etc. In contrast, the pseudorandom noise biasing signals show no such periodicy and have a fairly constant, and low, amplitude throughout their frequency range (37.5 KHz to 62.5 KHz).

While the present invention has been described in considerable detail, it is understood that various improvements and modifications to the present invention would occur to one of ordinary skill and art. Accordingly, the foregoing is not intended to be limitative, but merely descriptive of the invention which is described in the appended claims.

What is claimed is:

1. A method of biasing a magnetic circuit to which is applied a periodic signal of interest comprising the steps of:
   generating a sequence of biasing signals having a random frequency distribution with respect to said periodic signal, wherein said biasing signals are random noise signals; and
   applying said sequence of biasing signals to said magnetic circuit.

2. A method of biasing a magnetic circuit to which is applied a periodic signal of interest comprising the steps of:
   generating a sequence of biasing signals having a random frequency ditribution with respect to said periodic signal, wherein said biasing signals are a pseudorandom noise sequence; and
   applying said sequence of biasing signals to said magnetic circuit.

3. Apparatus for biasing a magnetic circuit to which is applied a periodic signal of interest comprising:
   means for generating a sequence of biasing signals having a random frequency distribution with respect to said periodic signal, said generating means comprising a random noise generator; and
   means for applying said sequence to said magnetic circuit.

4. The apparatus of claim 3 wherein said magnetic circuit includes a least a magnetic recording head.

5. The apparatus of claim 3 wherein said magnetic circuit includes at least a Hall-effect device.

6. Apparatus for biasing a magnetic circuit to which is applied a periodic signal of interest comprising:
   means for generating a sequence of biasing signals having a random frequency distribution with respect to said periodic signal, said generating means comprising a pseudorandom noise generator; and
   means for applying said sequence to said magnetic circuit.

7. The apparatus of claim 6 wherein said magnetic circuit includes at least a magnetic recording head.

8. The apparatus of claim 6 wherein said magnetic circuit includes at least a Hall-effect device.

* * * * *